United States Patent [19]

Martin et al.

[11] Patent Number: 5,128,633
[45] Date of Patent: Jul. 7, 1992

[54] MULTI-LOOP SYNTHESIZER

[75] Inventors: Frederick L. Martin, Gainesville; Mohammad M. Ghomeshi, Ft. Lauderdale, both of Fla.

[73] Assignee: Motorola, Inc., Schaumburg, Ill.

[21] Appl. No.: 726,497

[22] Filed: Jul. 8, 1991

[51] Int. Cl.[5] .................................................. H03L 7/00
[52] U.S. Cl. ............................................ 331/2; 331/25; 328/14
[58] Field of Search ................. 331/2, 18, 25; 328/14

[56] References Cited

U.S. PATENT DOCUMENTS

| | | | |
|---|---|---|---|
| 4,839,603 | 6/1989 | Mower et al. | 331/2 X |
| 4,912,432 | 3/1990 | Galani et al. | 331/2 |
| 4,963,838 | 10/1990 | Hareyama | 331/2 |
| 4,994,762 | 2/1991 | Tay | 331/2 |
| 5,038,115 | 8/1991 | Myers et al. | 331/2 |

OTHER PUBLICATIONS

"Phase Locked Techniques", by F. M. Gardner, John Wiley and Sons, Inc., 1966, Techniques of Acquisition, p. 53.

Primary Examiner—Robert J. Pascal
Attorney, Agent, or Firm—M. Mansour Ghomeshi; Daniel K. Nichols

[57] ABSTRACT

Briefly, according to the invention, a multi-loop synthesizer (100) for producing an output signal (114) having minimum spurious components is described. The multi-loop synthesizer (100) includes a first synthesizer loop (116) which has a divider stage (108) and an oscillator stage (106) for providing an oscillator output signal (118). The multi-loop synthesizer (100) also includes at least one additional synthesizer loop (121) which also has an output for providing a loop output signal (120). The multi-loop synthesizer (100) further includes an image balanced mixer (110) coupled to the divider stage (108) of the first synthesizer loop for mixing the oscillator output signal (118) of the first synthesizer loop (116) with the loop output (120) of the at least one additional synthesizer loop (121).

23 Claims, 3 Drawing Sheets

MULTI-LOOP SYNTHESIZER

TECHNICAL FIELD

This invention pertains to radio frequency synthesizers and more particularly to radio frequency synthesizers having more than one loop.

BACKGROUND

Frequency synthesizers are well known in the art and are commonly used to generate reference signals in communication devices. Frequency synthesizers are available in a variety of topologies with varying scope of performance. Some topologies use a single loop phase locked loop to provide a closed loop and thereby accurately lock to a desired signal. Others use multiple phase locked loops to lock to a desired channel with more accuracy and with less noise. The latter has been used in more sophisticated synthesizer circuits with more stringent requirements. With ever more increasing demands on communication devices to accommodate more users, the need to more efficiently utilize the available frequency spectrum increases. This has been accomplished by squeezing more channels in the operating band by placing them closer to each other. Some of the problems with narrow channel spacing are spurious noise and frequency accuracy. Both of which are present in all systems and must be sufficiently controlled prior to successful communication. However, due to the closer channel spacing, spurs must be sufficiently attenuated at frequencies close to the carrier. Another approach of allowing more users to operate in a particular portion of the frequency spectrum has been the use of time division multiplexing (TDM). The channel spacing in TDM systems may also be required to be narrow. Furthermore, these systems use fast lock synthesizers to provide them with the required fast frequency switching.

Multi-loop synthesizers are good candidates to combat the problems observed in the aforementioned systems. A variety of multi-loop synthesizers are available using a multiple of phase locked loops in series. In some applications, each loop is used as the reference signal generator for the next loop. A problem with this approach is that exact frequencies can not always be achieved due to the nature of integer dividers that are used with the loops. No significant spurious response improvement can be realized with these synthesizers. Furthermore, the synthesizer settling (lock) time is not improved over the single loop synthesizer due to the need for narrow band filters. It is clear that this type of multi-loop synthesizer while attempting to solve one type of problem is inadequate to solve another. It is therefore clear that a need exists for a synthesizer that achieves low spurious response and which is able to fast lock to any desired frequency.

SUMMARY OF THE INVENTION

Briefly, according to the invention, a multi-loop synthesizer for producing an output having minimum spurious components is described. The multi-loop synthesizer includes a first synthesizer loop which has a divider stage and an oscillator stage for providing an oscillator output signal. The multi-loop synthesizer also includes at least one additional synthesizer loop which also has an output for providing a loop output signal. The multi-loop synthesizer further includes an image balanced mixer means coupled to the divider stage of the first synthesizer loop for mixing the oscillator output signal of the first synthesizer loop with the loop output of the at least one additional synthesizer loop.

DETAILED DESCRIPTION OF THE PREFERRED EMBODIMENT

Figure 1:
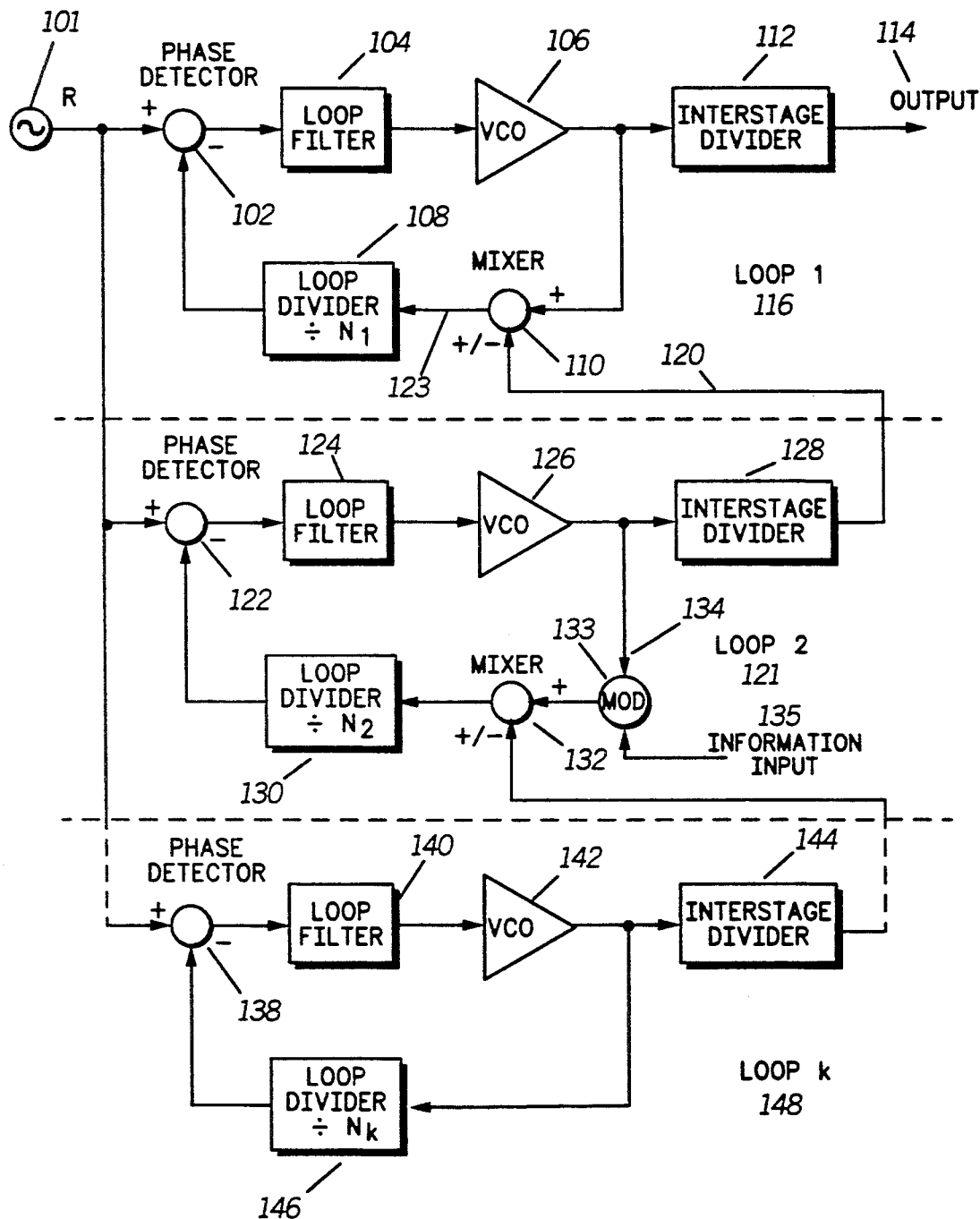
FIG. 1 is a multi-loop synthesizer in accordance with the principles of the present invention.

Referring to FIG. 1, a block diagram of a multi-loop synthesizer 100 is shown to demonstrate the principles of the present invention. The block diagram comprises a plurality of synthesizer loops identified by 116 loop 1, 121 loop 2, and 148 loop k. As can be seen, any number of loops can be used depending on the particular application and system requirements. The synthesizer loops 116, 121, and 148 are coupled to a common reference oscillator signal 101 at their respective phase detectors. The reference signal can be directly coupled to each loop as shown in FIG. 1 or coupled through fixed or programmable dividers such that not all loops operate using the same reference frequency. The elements of each of the loops 116, 121, and 148 are similar as can be seen from FIG. 1. In general, each synthesizer loop (116, 121, and 148) includes a phase detector (102, 122, and 138), a loop filter (104, 124, and 140) with transfer function $F_i(s)$, a VCO (106, 126, and 142) with gain constant $K_{vi}$, and a programmable loop divider (108, 130, and 146) with modulus $N_i$. Also included in the synthesizer 100 are three interstage dividers 112, 128, and 144 with modulus $P_i$ coupled to the output of the loops 116, 121, and 148, respectively. Each phase locked loop synthesizer output is divided in frequency by its respective interstage divider with fixed modulus $P_i$ before being injected into the next stage or loop. The interstage dividers 112, 128, and 144 provide more flexibility in achieving desired frequencies at the output signal 114. The elimination of the interstage divider 112 is possible without departing from the objectives of the present invention. The filter transfer function $F_i(s)$, the VCO gain constant $K_{vi}$, the interstage divider modulus $P_i$, and the divider modulus $N_i$ may all assume different values to meet various requirements of the synthesizer 100. The synthesizer loops 116, 121, and 148 are preferably of the phase locked loop type.

The loop 121 includes an angle modulator 133 which is placed in the feed back loop from the VCO 126 to the mixer 132. The modulator 133 provides the means for modulating the output signal 114. The first input of the modulator 133 is coupled to the output of the VCO 126, signal 134. The modulating input of the modulator 133 is coupled to an information input signal 135. This signal 135 is a low frequency modulating signal that is intended to modulate the output signal 114 of the synthesizer 100. The output of the modulator 133 is coupled to the mixer 132 where it is mixed with the signal 136 from the loop 148. With the use of the modulator 133 it is possible to modulate the synthesizer output signal 114 internal to the loop. The modulator 133 can be placed in any one of the loops 116, 121, and 148 depending on the requirements of the system 100. Indeed the location of the modulator 133 can be calculated to take advantage of the optimum performance of the synthesizer 100. The modulation of the signal 114 using the modulator 133 does not exclude the use of other known modulation techniques. One such technique is to modulate the output signal 114 externally via conventional modulators. Other techniques using dual port modulators are also suitable for use with the synthesizer 100. These methods could be applied as an alternative or in addition to the modulator 133. Also modulation could be applied to the output signal 114 by coupling a modulated signal to the synthesizer 100 via an additional mixer in any of the loops 116, 121, or 148.

The series of synthesizer loops 116, 121, and 148 are coupled to each other via mixers 110 and 132. Each synthesizer loop that receives a signal from a prior synthesizer loop includes a mixer. Therefore the loop 148 is the only loop without a mixer. These mixers are of the image balanced type and are used to couple the output signal of loop i, as an offset signal, to loop (i-1). The use of the image balance mixer is necessary to produce only the sum or the difference output, not both as most other realizable multipliers do. Furthermore, the mixers 110 and 132 include switching means to selectively choose one or the other of the sum or the difference signals. More details will be provided on the operation of the mixers 110 and 132 later, in conjunction with FIG. 3.

In this embodiment, the mixer 110 is used to couple loop 121 to loop 116 and the mixer 132 is used to couple the loop 148 to loop 121. The first input of the mixer 110 is a signal 118 ($S_1$) from the output of the VCO 106. The second input to the mixer 110 is the output signal 120 ($S_2$) from the output of the interstage divider 128. The mixer 110 produces a signal 123 ($S_0$) which is coupled to the loop divider 108, preferably at the input port. The first input to the mixer 132 is the output signal of the modulator 133. The output signal of the interstage divider 144 is injected into the mixer 132 via its second input. The output of the mixer 132 is coupled to the loop divider 130. Included in the mixers 110 and 132 are switching apparatuses that are used to provide the low or the high side signals at the respective outputs of their mixers. The operation of these switching apparatuses will be described in more detail in conjunction with FIG. 3.

The output of the synthesizer 100 is a signal 114 available at the output of the interstage divider 112 of the first loop 116. To provide a better understanding of the operation of the synthesizer 100, the description of one of the loops, namely 116 is provided. The synthesizer 100 may include only two synthesizer loops. This number of loops is sufficient for meeting the objectives of the present invention.

Figure 2:
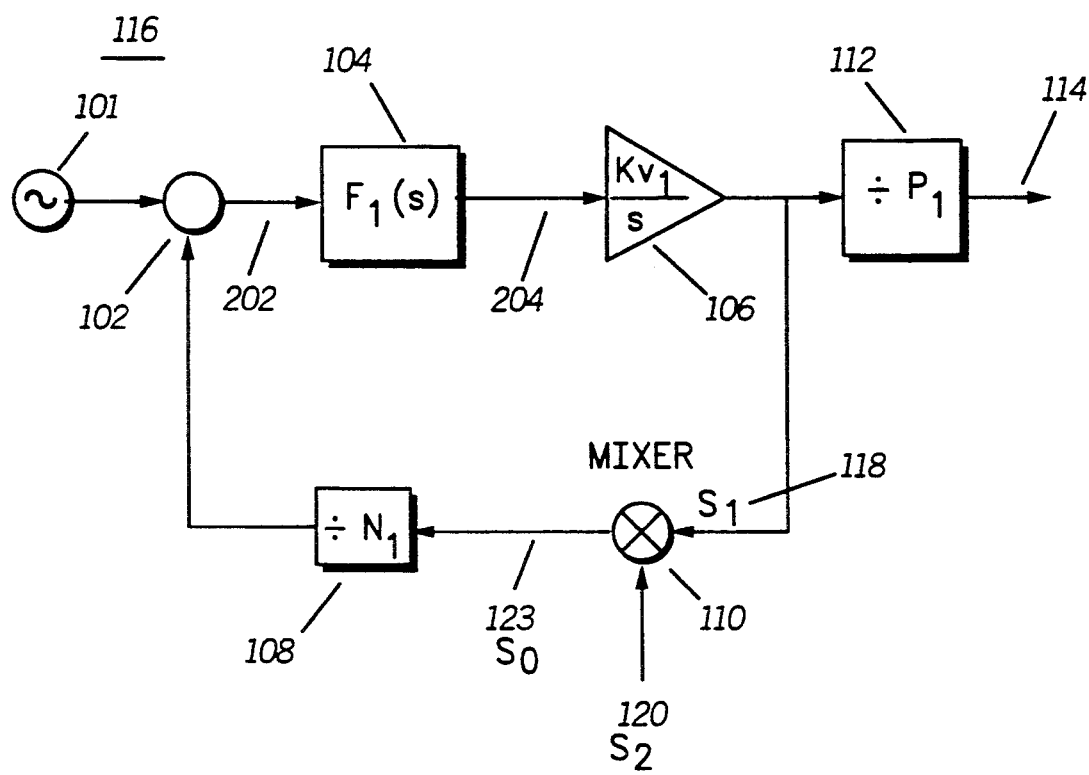
FIG. 2 is a block diagram of a single loop of the multi-loop synthesizer of FIG. 1 in accordance with the present invention.

Referring now to FIG. 2, a block diagram of the elements of the phase locked loop 116 are presented once again for a more close analysis. The first input of the phase locked loop 116 is coupled to the reference input signal 101. This reference input signal 101 is a stable signal used by the loop 116 to lock to a particular frequency. The second input of the phase detector 102 is coupled to the output of a divide by $N_1$ block 108. The phase detector 102 produces a signal 202 which is proportional to the phase difference between the two input signals. This phase differential signal 202 is coupled to the filter 104 having a characteristic as defined by $F_1(s)$. This characteristic is normally low pass and is adopted to remove noise components that may be riding on the signal 202. The output signal of the filter 104 is a control signal 204 and is coupled to the voltage controlled oscillator 106 to control its operating frequency. The transfer function of the voltage control oscillator 106 is represented by $K_{v1}/s$. The output signal 118 of the VCO 106 is coupled to the interstage divider 112 with modulus $P_1$. The output of this divider 112 is the output signal 114 which is the output of the synthesizer 100. The signal 118 is also coupled to the first input of the mixer 110. The second input to the mixer 110 is the signal 120 which is the output of a subsequent loop, namely loop 121. At the mixer 110, the two signals 118 ($S_1$) and 120 ($S_2$) are mixed resulting in signal 123 ($S_0$) which is applied to the phase detector 102 via the divide by $N_1$ divider 108, thereby closing the loop. The operation of the synthesizer loop 116 is briefly described here. For a more detailed understanding of general purpose phase locked loops refer to "Phase Locked Techniques", by F. M. Gardner, John Wiley and Sons, Inc., 1966. In general, the steady state relationship of the frequency of the output signal 114 to the reference frequency 101 is described by $$f_O = \left(f_R N_1 \pm \frac{f_2}{P_2}\right)\frac{1}{P_1}$$

where $f_0$ represents the frequency of the output signal 114, $f_R$ represents the frequency of signal 101, $N_1$ represents the modulus of the divider 108, and $f_2/P_2$ represents the frequency of the signal 120 ($S_2$), the second injection to mixer 110. This expression developed for loop 116 can be applied recursively to define all loop output frequencies in the synthesizer 100. For the case where the mixers 110 and 132 produce the difference of their input frequencies, the output frequency of loop i takes the following arrangement $$f_i = \left(f_R N_i + \frac{f_{i+1}}{P_{i+1}}\right)/P_1$$

Successive application of the formula shown above through the system results in the following expression for the output signal 114

$$f_O = \frac{f_R N_1 + \frac{f_2}{P_2}}{P_1} = \frac{f_R N_1}{P_1} + \frac{f_2}{P_1 P_2} + \cdots + \frac{f_R N_K}{P_1 P_2 \ldots P_k}$$

From this general formula, it can be seen that the frequency resolution of the synthesizer 100 is finer than the frequency resolution of any phase locked loop in the synthesizer 100. It is demonstrated that by the use of a number of synthesizer loops 116, 121, and 148, the output signal 114 may take any frequency as controlled by dividers 108, 130, 146 and interstage dividers 112, 128, and 144. This added benefit is provided with minimum compromise in the operation of the individual synthesizers 116, 121, and 148. Note that from the final calculation of $f_0$, the steady state effect of a change in the output frequency of synthesizer loop 148 is reduced at the output signal 114 by a factor equal to the product of the modulus values $P_1 P_2 \ldots P_K$ of all the interstage dividers 112, 128, and 144 respectively. Thus, the channel spacing of the synthesizer 100 is the channel spacing of individual loops divided by the P values and the synthesizer 100 is highly immune to disturbances in high number loops. Furthermore, phase perturbation induced at loop 148 is reduced by the product of the P values and by the filter characteristics of filters 104, 124, and 140. With the use of the multi-loops 116, 121, and 148 along with the interstage dividers 112, 128, and 144 all desired frequencies can be achieved without the use of a low frequency reference signal 101. The use of a high frequency reference signal permits the loop filters 104, 124, and 140 to have wide bandwidths. This results in a significant reduction in the settling time of the loop filters 104, 124, and 140 which results in the reduction of the overall settling time of the synthesizer 100. The low settling time of the synthesizer 100 permits its use in communication devices requiring fast switching between frequencies, such as time division multiplexing systems. This is another benefit of the multi-loops of the synthesizer 100.

Note that with the loop filters 104, 124, and 140 having wide bandwidth characteristics, it is feasible to modulate the output signal 114, via the information input signal 135, internal to the loop using the modulator 133. This internal modulation is possible since the bandwidth of the filters 104, 124, and 140 are wide enough to allow the information input signal 135 to flow through unrestricted. Several benefits are offered by the internal modulation of the output signal 114. One significant benefit is the ability to flatly modulate the output signal 114 across its operating band without the use of compensatory networks. Conversely, compensation networks are needed in producing flat modulation in modulated synthesizer networks with narrow bandwidth.

In summary, a multi-loop synthesizer is described having a plurality of loops to produce signals with low channel spacing and substantially low spurious noise. Each of the loops includes an interstage divider that divides the frequency of that loop output before coupling it to the next loop. The coupling between the loops is accomplished via mixers which mixes the outputs of two sequential loops. The coupling of the mixers to the loops is through the loop dividers. With the multi loops having interstage dividers, the channel spacing of the signals at the output of the synthesizer can be more more accurately controlled with higher number of increments. In other words lower channel spacing is afforded without the use of narrow band filters which inherently have high settling times.

Figure 3:
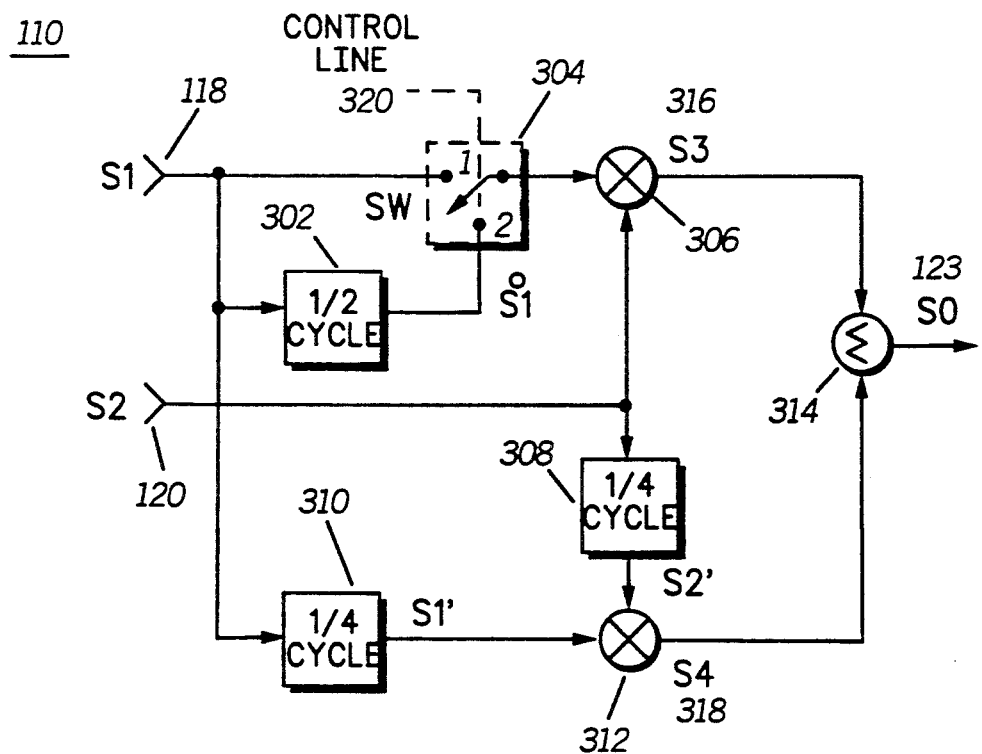
FIG. 3 is a block diagram of an image balanced mixer in accordance with the principles of the present invention.

Referring now to FIG. 3, a block diagram of the image balanced mixer 110 is shown in accordance with the present invention. The image balanced mixer 110 is a representative of all of the image balanced mixers 110 and 132 used in the synthesizer 100. The operation of all these mixers 110 and 132 are identical. The image balanced mixer 110 includes two balanced mixers 306 and 312, two ¼ cycle time shifters 308 and 310, one adder 314, one ½ cycle time shifter 302, and one switch 304. The inputs to the mixer 312 are the two input signals 118 ($S_1$) and 120 ($S_2$) shifted in time by ¼ cycle time shifters 308, 310, respectively. For ease of calculation, sinusoidal signals are considered and the output signals of time shifters 310 and 308 are labeled $S_1'$ and $S_2'$, respectively. Note that time shifting of a sinusoidal signal is the same as phase shifting it. A time shift of ½ cycle is equal to 180° phase shift while a time shift of ¼ cycle is equal to 90° phase shift. Indeed time and phase shifting have been used interchangeably to refer to the same operation. The first input of the mixer 306 is coupled to the signal 120 ($S_2$). The second input of the mixer 306 is coupled to the output terminal of the switch 304. The switch 304 is a controllable two throw switch having its first terminal coupled to the signal 118 ($S_1$). The second terminal of the switch 304 is coupled to the ½ cycle time shifter 302. The input to the time shifter 302 is the signal 118 ($S_1$). The output of the time shifter 302 is labeled $S°_1$. The output terminal of the switch 304 is coupled to the first input of the mixer 306. The second input to the mixer 306 is the signal 120 ($S_2$). Under the control of a controller, the switch 304 switches between signal 118 ($S_1$) and the same signal time shifted by ½ cycle $S°_1$. The control signal from the controller is coupled to the switch 304 via a control line 320. Output signals 316 ($S_3$) and 318 ($S_4$) of mixers 306 and 312 are applied to the summer 314 whose output is signal 123 ($S_0$).

With the use of switch 304 and the time shifter 302, the output frequency of the signal 123 ($S_0$) can selectively be the sum or the difference of the frequencies of the two input signals 118 ($S_1$) and 120 ($S_2$). With the switch 304 in the top position (position 1), the output signal 123 ($S_0$) is the sum of the two input signals 118 ($S_1$) and 120 ($S_2$). Conversely, the output signal 123 ($S_0$) will be the difference of the two input signals 118 ($S_1$) and 120 ($S_2$) with the switch 304 in the bottom position (position 2). The following calculations show the principles of the operation of the image balanced mixer 110. Assuming sinusoidal inputs at 118 ($S_1$) and 120 ($S_2$) with unit amplitude, the input signals can be expressed as $$S_1(t) = \cos(\omega_1 t + 0°)$$

$$S_2(t) = \cos(\omega_2 t + 0°)$$

where $\omega_1$ and $\omega_2$ are the radian frequencies of 118 ($S_1$) and 120 ($S_2$), respectively. At the phase shifters 302, 308, and 310 the signals are $$S°_1(t) = \cos(\omega_1 t + 180°),$$

$$S_2'(t) = \cos(\omega_2 t + 90°),$$

$$S_1'(t) = \cos(\omega_1 t + 90°)$$

respectively.

For the purposes of the present invention, it is assumed that the mixers 306 and 312 effect an ideal multiplier operation. Then for the case where the switch 304 is in the top position (position 1), hence signal 118 ($S_1$) is applied to the mixer 306, the mixer's output 316 ($S_3$) is $$S_3(t) = S_1(t) * S_2(t) = \cos(\omega_1 t + 0°) \cos(\omega_2 t + 0°) = \tfrac{1}{2} \cos[(\omega_1 - \omega_2)t] + \tfrac{1}{2} \cos[(\omega_1 + \omega_2)t]$$

Similarly, the output of the mixer 312 is $$S_4(t) = S_1'(t) * S_2'(t) = \tfrac{1}{2} \cos[(\omega_1 + \omega_2)t + 180°] + \tfrac{1}{2} \cos[(\omega_1 - \omega_2)t + 0°].$$

when signals $S_3$ and $S_4$ are summed at the summer 314, the summation term is cancelled, leaving only the difference term $$S_0(t) = S_3(t) * S_4(t) = \cos[(\omega_1 - \omega_2)t + 0°].$$

If on the other hand, the switch 304 is set to position 2 such that the shifted version of signal 118 (S$_1$) is applied to mixer 306, then, 316 (S$_3$) becomes $$S_3(t) = S^*_1(t) \cdot S_2(t) = \tfrac{1}{2} \cos [(\omega_1 + \omega_2)t + 180°] + \tfrac{1}{2} \cos [(\omega_1 - \omega_2)t + 180°].$$

Once again, the output of the two mixers 306 and 312 are summed at the summer 314 to produce the signal 123 (S$_0$)

$$S_0(t) = S_3(t) + S_4(t) = \cos [(\omega_1 + \omega_2)t + 180°].$$

As can be seen, the difference term is cancelled at the output 123 (S$_0$). This demonstrates, that either the sum or the difference term can be selected according to the position of switch 304.

Note that FIG. 3 represents only one of many combinations of the relative positions of the time shifters 302, 308, and 310, and the switch 304 with respect to each other and with respect to the mixers 306 and 312. Other combinations are possible without departing from the spirit of the present invention. The use of the image balanced mixer including the switch 304 and the time shifter 302 allows the elimination of spurs that are attributed to individual loops in the synthesizer 100. By selecting the sum or the difference of the two mixed signals 118 (S$_1$) and 120 (S$_2$) at the mixer 110, the output signal 114 can be effectively spur free. Such maneuverability on the output signal of the mixer 306 provides significant spur immunity to the synthesizer 100. In other words, the switch 304 affords the mixer 110 the freedom to select the high or low frequency offset at the output signal 123 (S$_0$). If a set of synthesizer loop output frequencies produced an undesirable spurious signals at the output signal 114 those spurs can be substantially eliminated by changing the position of the switch 304. The operation of the switch 304 will be controlled by a controller which has access to a data bank storing information on various spurs associated with the output signal 114. The knowledge of the spectral locations of spurious signals associated with a particular output frequency allows the controller to select the right setting on the switch 304 aimed at eliminating that spurious signal. Although the mixer 110 of the present invention has been shown to include the time shifter 302 and the switch 304, it is not necessary for these elements 302 and 304 to reside in with the mixer 110. A separate module which includes the shifter 302 and switch 304 may be used.

In summary, the image balanced mixer 110 is used in conjunction with the multi-loop synthesizer 100 to provide narrower channel spacing without the added spurs that are inherent to such systems. The image balanced mixer 110 includes the switch 304 and the time shifter 302 which allows the injection to change so as to provide the difference or summation of the two input signals 118 (S$_1$) and 120 (S$_2$) at the output of the mixer 306. This results in the substantial elimination of spurs that would appear at the output signal 114.

Figure 4:
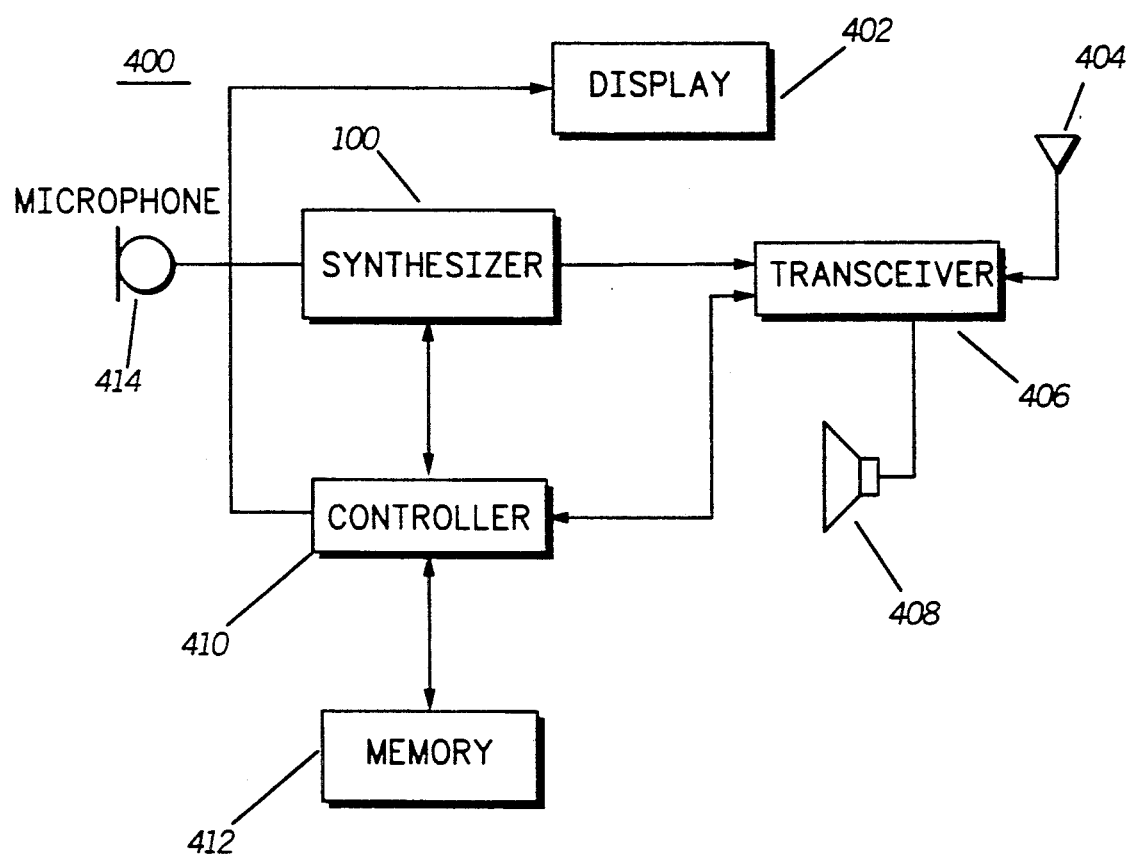
FIG. 4 is a block diagram of a communication device in accordance with the present invention.

Referring now to FIG. 4., a block diagram of a communication device 400 is shown in accordance with the present invention. The communication device 400 includes an antenna 404 which is used to transmit and receive radio frequency signals. The antenna 404 is coupled to a transceiver 406 which processes receive and transmit signals. The transceiver 406 includes circuitry to selectively switch between transmit and receive mode. Coupled to the transceiver 406 is the synthesizer 100. The output signal 114 provides the local reference oscillator signal for the transceiver 406. The operation of the transceiver 406 is controlled via a controller 410 which also controls the operation of the synthesizer 100.

Receive signals are processed and demodulated by the elements of the transceiver 406. Voice components of the receive signal are coupled to a speaker 408. Data components of the receive signal after being analyzed and decoded by the controller 410 are displayed on a display 402. A microphone 414 provides the information input signal 135 to the synthesizer 100. The microphone 414 includes all the necessary circuitries to process audio signals before they are applied to the synthesizer 100. In the transmit mode, the modulated output signal 114 is coupled to the transceiver 406 where it is filtered, amplified, and coupled to the antenna 404 for transmission. The controller 410 controls the operation of the switch 304 in the mixer 110 plus the operation of all similar switches in the other mixers used in the synthesizer 100. Furthermore, the controller 410 provides switching for the modulator 133. In the receive mode the modulator 133 is decoupled so that the output signal 114 provides merely a reference signal. However, in the transmit mode the modulator 133 is switched in to allow the output signal 114 to become a modulated carrier signal. A memory block 412 is coupled to the controller 410 and provides it with a table of switch settings which produce acceptable spurious performance for each required system output frequency. Information from the table will be included as part of the programming information of the synthesizer 100. The table can be generated theoretically from a computer analysis or empirically from physical measurements of the various frequencies of the output signal 114. To change the operating frequency of the transceiver 406, a request is made to the synthesizer 100 to produce a signal having a particular frequency. Generally this request is made vis the controller 410 which receives direction from a user. The controller 410 looks up the preferable switch settings from the memory 412. With this information availble, the switches in the mixers 110 and 132 are accordingly set to minimize the spurs of the output signal 114.

The action performed by the image balanced mixer 110 is similar to flipping injection sides on an LO signal in a receiver. However, there are differences between the receiver technique and the one described in the present invention. First, in the receiver approach, the characteristics of the mixer and the filter at its output do not change when the injection side is changed. In the present invention, however, the mixer 110 is physically altered by changing the setting of the switch 304. Second, in the receiver case, the output of the mixer, the IF signal, is maintained at a constant frequency. In the present invention, this changes and the IF signal does not remain constant.

The multi-loop synthesizer 100 possesses a number of benefits that are beyond those offered by regular synthesizers. Close channel spacing is possible without the use of a low frequency reference signal. With no need for a low frequency reference oscillator, the need for a narrow loop filter in the synthesizer loop is eliminated. Instead, a wide loop filter can be used with the relatively high reference frequency signal. This lends itself to a significant reduction in the settling time of the synthesizer which is also a valuable benefit of the present invention. Furthermore, with the use of a phase shifter and a switch at the mixer output the frequency spurs, otherwise persistent, can be eliminated. Generally these spurs can be fairly close to the output signal of the synthesizer, rendering it difficult to eliminate them without the use of a sophisticated filters. One of the significant benefits of the multi-loop synthesizer 100 is the low channel spacing of the signals that are available at its output.

It is understood that reference is at times made to components of one of the loops of the synthesizer 100. Whenever appropriate, such references are meant to include similar components from other loops. It is further understood that the operation of similar components is identical for all the loops in the synthesizer 100. It is clear that minor changes may be made to the elements of the preferred embodiment without departing from the spirit of the invention. The presentation of the particular embodiment described herein is intended to provide the preferred embodiment of the present invention. Such presentation is in no way to be construed as the only embodiment of the present invention. Nor shall it be viewed as a limitation.

This invention eliminates the need for narrow loop filters that are needed in conjunction with low reference oscillators used to achieve close channel spacings. The significant benefit of not having to use narrow bandwidth filters is the reduction in the settling time that can be realized with wide bandwidth filters. The time shifter 302 along with the switch 304 provide a method for the elimination of spurs close to the carrier that would have otherwise been removed with the narrow loop filters. It can be seen that several features of synthesizers not previously possible to coexist are offered by the multi-synthesizer 100 of the present invention. Although it has been shown that one reference oscillator is used to provide the same reference signal to loops 116, 121, and 148. It is well understood that this reference signal may vary for the different loops. This may be accomplished with the use of multiple reference oscillators or with the use of a single reference oscillator coupled to separate loops via dividers. The use of a variety of reference signals allows for more flexibility for the channel spacing at the output signal 114.

What is claimed is:

1. A multi-loop synthesizer for producing an output with minimum spurious components, comprising:
   a first synthesizer loop having a divider stage and an oscillator stage for providing an oscillator output signal;
   at least one additional synthesizer loop having an output for providing a loop output signal; and
   image balanced mixer means coupled to the divider stage of the first synthesizer loop for mixing the oscillator output signal of the first synthesizer loop with the loop output of the at least one additional loop, the image balance mixer means including means for selectively time shifting the oscillator output signal of the first synthesizer loop before mixing it with the loop output signal of the at least one additional synthesizer loop.

2. The multi-loop synthesizer of claim 1 further including at least one interstage divider.

3. The multi-loop synthesizer of claim 1, further including means for modulating the output signal.

4. The multi-loop synthesizer of claim 1, wherein the means for selectively shifting comprises a switch.

5. The multi-loop synthesizer of claim 1, wherein the means for selectively time shifting the output signal of the first synthesizer loop includes means for shifting the output signal by ½ cycle.

6. A synthesizer, comprising:
   a first synthesizer loop having a divider stage and an oscillator stage for providing an oscillator output signal;
   at least one additional synthesizer loop having an output for providing a loop output signal;
   image balanced mixing means having an output coupled to the divider stage of the first synthesizer loop;
   a time shifter for producing a shifted signal;
   switching means coupled to the image balanced mixing means for selectively coupling the oscillator output of the first synthesizer loop or the shifted signal to the image balanced mixing means; and
   modulator means coupled to the at least one additional loop for modulating the loop output signal.

7. The synthesizer of claim 6, wherein the image balanced mixing means includes the time shifter.

8. The synthesizer of claim 6, wherein the image balanced mixing means includes the switching means.

9. A synthesizer for producing a substantially spur free signal, comprising:
   a plurality of synthesizer loops each including:
      an oscillator means having an output for providing an oscillator output signal;
      a divider means; and
      a mixer means for mixing the oscillator output signal of a first synthesizer loop with the oscillator output signal of a second synthesizer loop, the mixer means comprising:
         means for selectively time shifting the oscillator output signal of the first synthesizer loop before coupling it to the mixer means.

10. The synthesizer of claim 9, wherein one of the plurality of synthesizer loops further includes a modulator means for modulating the oscillator output signal.

11. The synthesizer of claim 9, wherein the mixer means includes an image balanced mixer.

12. The synthesizer of claim 9, wherein the mixer is coupled to the divider means.

13. The synthesizer of claim 9, wherein the oscillator means includes a voltage controlled oscillator.

14. The synthesizer of claim 9, wherein the means for selectively time shifting includes means for selectively phase shift the oscillator output signal of the second loop.

15. In an oscillator circuit having at least one image balanced mixer, a first synthesizer loop having a divider stage, and at least one more synthesizer loop having a divider stage, a method for producing a substantially spur free signal, comprising the steps of:
   generating a first oscillator output signal using the first synthesizer loop;
   generating an offset oscillator signal using the at least one more synthesizer loop;
   selectively phase shifting the first oscillator output signal to produce a shifted signal; and
   mixing the shifted signal with the offset oscillator signal to produce a mixed signal.

16. The method of claim 15, further including the step of coupling the mixed signal to the divider stage of the first synthesizer;

17. The method of claim 15, further including the step of modulating the offset oscillator signal.

18. A communication device, comprising:
   a multi-loop synthesizer, including:

a first synthesizer loop having a divider stage and an oscillator stage for providing an oscillator output signal;

at least one additional synthesizer loop having an output for providing a loop output signal;

image balanced mixer means coupled to the divider stage of the first synthesizer loop for mixing the oscillator output signal of the first synthesizer loop with the loop output signal of the at least one additional loop;

a time shifter for producing a time shifted signal;

switching means coupled to the image balanced mixing means for selectively coupling the oscillator output of the first synthesizer loop or the shifted signal to the image balanced mixing means; and controller means for controlling the operation of the switching means.

19. The communication device of claim 18, wherein the image balanced mixer includes means for selectively shifting the output signal of the synthesizer loop by one half cycle.

20. The communication device of claim 18, wherein the at least one additional synthesizer loop includes a modulator means for modulating the oscillator output signal.

21. A multi-loop synthesizer, comprising:

a series of synthesizer loops each having a divider stage and an output port for producing an output signal, the output signal of each loop is used as an offset signal to a subsequent loop, each loop comprising:

an image balanced mixer coupled to the divider stage of a first synthesizer loop for mixing the output of the first synthesizer loop with the output of a subsequent synthesizer loop; and a time shifter for selectively time shifting the output of the first synthesizer loop before mixing it with the output of the subsequent synthesizer loop.

22. The multi-loop synthesizer of claim 21, wherein the series of synthesizer loops includes two loops.

23. The multi-loop synthesizer of claim 21, further including means for modulating the output signal.

* * * * *